US006660595B2

United States Patent
Rodder

(10) Patent No.: US 6,660,595 B2
(45) Date of Patent: Dec. 9, 2003

(54) IMPLANTATION METHOD FOR SIMULTANEOUSLY IMPLANTING IN ONE REGION AND BLOCKING THE IMPLANT IN ANOTHER REGION

(75) Inventor: Mark S. Rodder, University Park, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 09/839,718

(22) Filed: Apr. 20, 2001

(65) Prior Publication Data

US 2001/0046758 A1 Nov. 29, 2001

Related U.S. Application Data

(60) Provisional application No. 60/206,322, filed on May 23, 2000.

(51) Int. Cl.[7] .................. H01L 21/8236; H01L 21/336; H01L 21/76; H01L 21/30; H01L 21/762
(52) U.S. Cl. .............. 438/276; 438/298; 438/450; 438/451; 438/982; 257/E21.557
(58) Field of Search ................. 438/525, 276, 438/298, 450, 451, 982; 257/E21.557

(56) References Cited

U.S. PATENT DOCUMENTS

| | | | | |
|---|---|---|---|---|
| 5,432,107 A | * | 7/1995 | Uno et al. ............... | 437/35 |
| 5,488,004 A | * | 1/1996 | Yang ....................... | 437/35 |
| 5,624,859 A | * | 4/1997 | Liu et al. ................ | 438/298 |
| 5,688,701 A | * | 11/1997 | Kobayashi et al. ..... | 437/29 |
| 5,700,728 A | * | 12/1997 | Kuo et al. ............... | 438/216 |
| 5,795,801 A | * | 8/1998 | Lee ......................... | 438/199 |
| 5,874,346 A | * | 2/1999 | Fulford et al. .......... | 438/433 |
| 6,066,885 A | * | 5/2000 | Fulford, Jr. et al. .... | 257/508 |
| 6,083,794 A | * | 7/2000 | Hook et al. ............. | 438/286 |
| 6,146,944 A | * | 11/2000 | He et al. ................. | 438/258 |
| 6,159,790 A | * | 12/2000 | Gonzalez et al. ....... | 438/253 |
| 6,171,914 B1 | * | 1/2001 | Liao et al. .............. | 438/302 |

* cited by examiner

*Primary Examiner*—Wael Fahmy
*Assistant Examiner*—Shrinivas H. Rao
(74) *Attorney, Agent, or Firm*—Jacqueline J. Garner; W. James Brady, III; Frederick J. Telecky, Jr.

(57) ABSTRACT

A method of fabricating different transistor structures with the same mask. A masking layer (214) has two openings (204, 202) that expose two transistor areas (304,302). The width of the second opening (202) is adjusted such that the angled implant is substantially blocked from the second transistor area (302). The angled implant forms pocket regions in the first transistor area (304). The same masking layer (214) may then be used to implant source and drain extension regions in both the first and second transistor areas (304, 302).

14 Claims, 2 Drawing Sheets

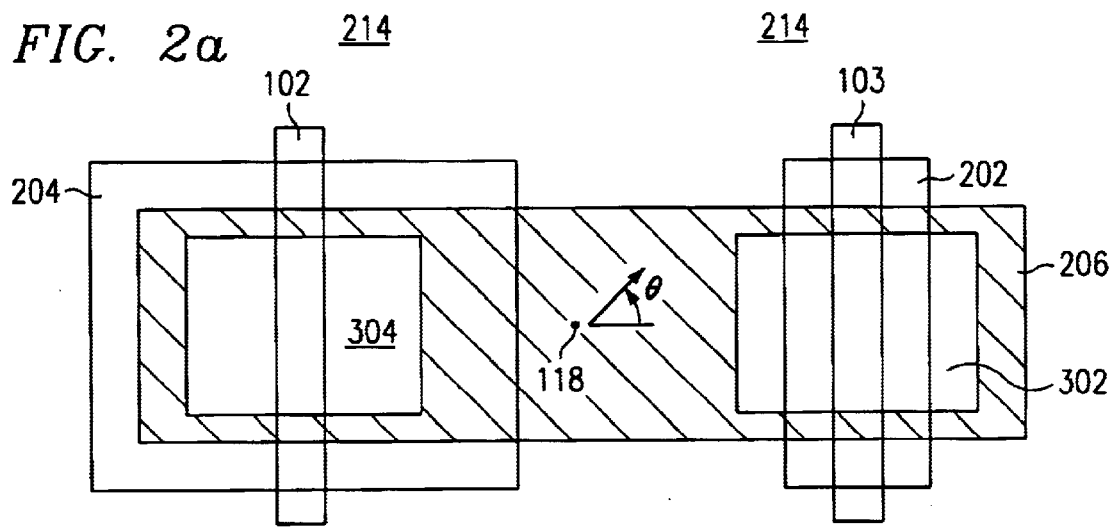
FIG. 2a
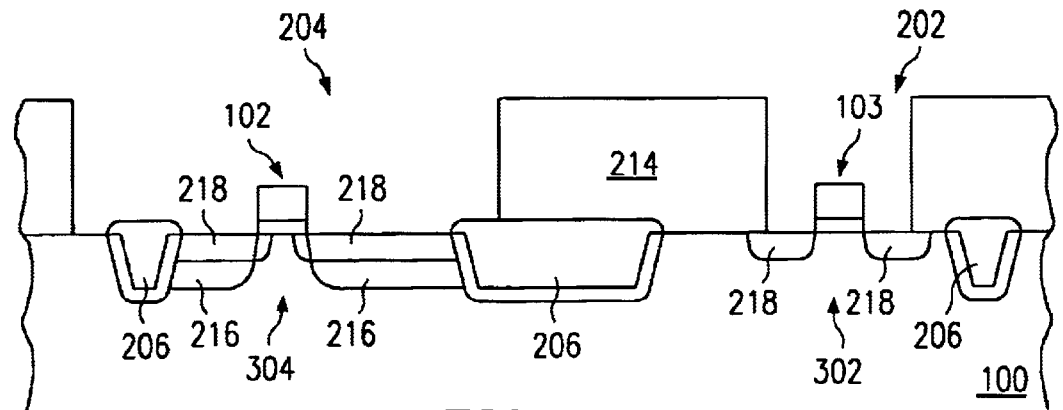
FIG. 2b
FIG. 2c

IMPLANTATION METHOD FOR SIMULTANEOUSLY IMPLANTING IN ONE REGION AND BLOCKING THE IMPLANT IN ANOTHER REGION

This application claims priority under 35 U.S.C. §119(e)(1) of provisional application No. 60/206,322 filed May 23, 2000.

FIELD OF THE INVENTION

The instant invention pertains to semiconductor device fabrication and processing and more specifically to a method of implanting dopant into one region of silicon material while blocking the implantation in another region.

BACKGROUND OF THE INVENTION

Implantation of dopants into the semiconductor substrate (or epitaxial silicon layer which overlies the semiconductor substrate) is important in semiconductor device fabrication. Many different implantation steps need to be performed so as to: dope the polycrystalline silicon ("poly" or "polysilicon") gate structure, form drain extensions, form pockets, form source and drain regions, form isolation structures, and to increase or decrease the conductivity of semiconductor structures. A problem with all of these implantation steps is that they may require separate masks (see mask 106 of FIGS. 1a and 1b) so as to block the implantation of dopants from one region while exposing other regions (see open region 108 of FIGS. 1a and 1b) to the implantation of dopants. Formation of these masks is very expensive and can be quite difficult to implement due to the ever-shrinking feature sizes and the difficulties associated with present limitations on photolithography. Some relief from these problems can be achieved by using existing structures to act as masks for the implantation of dopants. For example, the gate structure 102 (not including a sidewall spacer) and the isolation structures can be used to define the region where the drain extensions are formed. In addition, the isolation structures and the gate structure, which includes a sidewall spacer, can be used to define the region in which dopants are implanted to form the source and drain regions. However, this self-alignment methodology can not solve all of the problems related to precisely implanting dopants into these semiconductor structures.

Typically, dopants are implanted into the semiconductor structure normal to the semiconductor wafer (hereinafter referred to as an angle, phi, which would be equal to zero degrees if it were normal to the wafer). However, implanting normal to the wafer can be problematic. Some of the problems associated with implanting normal to the wafer include: dopant channeling and inability to position dopants sufficiently laterally underneath a masked region. In an effort to alleviate these problems, semiconductor device manufacturers have started to implant dopants at an angle from the normal to the wafer. In order to properly implant into the areas which are to be doped, semiconductor device manufacturers have altered their implantation methodology so as to implant a quarter of the dopants with angle phi being non-zero at an angle from 7–50 degrees with the dopants striking the wafer normal to the gate structure (hereinafter referred to as angle theta with theta being at zero degrees when normal to the gate structure)[see angle 110 of FIG. 1a]. The other three-quarters of the dopants being implanted when theta is at 90 degrees (angle 116 of FIG. 1a), 180 degrees (angle 114 of FIG. 1a) and 270 degrees (angle 112 of FIG. 1a), respectively.

While this angled implantation solves some of the problems associated with implantation normal to the substrate, it does not lessen the number of masking steps required to form all of the different doped structures. Hence, there is a need for a methodology which will result in one structure being implanted with a dopant while another structure remains free of those dopants without having to use multiple masking steps.

SUMMARY OF THE INVENTION

The invention is a method of fabricating an integrated circuit that uses a shadowing effect to block dopants from an exposed area. A layer, such as a masking layer, is formed exposing two regions of the semiconductor body. The width of the second region is less than the width of the first region. A dopant is implanted at an angle, phi, from normal using the layer and rotating the semiconductor body at off angles, theta, so as to implant the dopant into the first exposed region but not substantially into the second exposed region.

In one embodiment, the invention is used to form pocket regions in one transistor but not another. A masking layer has two openings that expose two transistor areas. The width of the second opening is adjusted such that the angled implant is substantially blocked from the second transistor. The angled implant forms pocket regions in the first transistors. The same masking layer may then be used to implant source and drain extension regions in both the first and second transistors.

An advantage of the invention is providing a method of fabricating an integrated circuit using a reduced number of masking levels.

BRIEF DESCRIPTION OF THE DRAWINGS

FIG. 2a is a top view of a partially fabricated device which is fabricated using the method of one embodiment of the instant invention.

FIGS. 2b and 2c are cross-sectional views of a partially fabricated device which is fabricated using the method of one embodiment of the instant invention.

Similar reference numerals are used throughout the figures to designate like or equivalent features. The figures are not drawn to scale. They are merely provided to illustrate the affect of the method of the instant invention.

DETAILED DESCRIPTION OF THE DRAWINGS

Figure 1A:
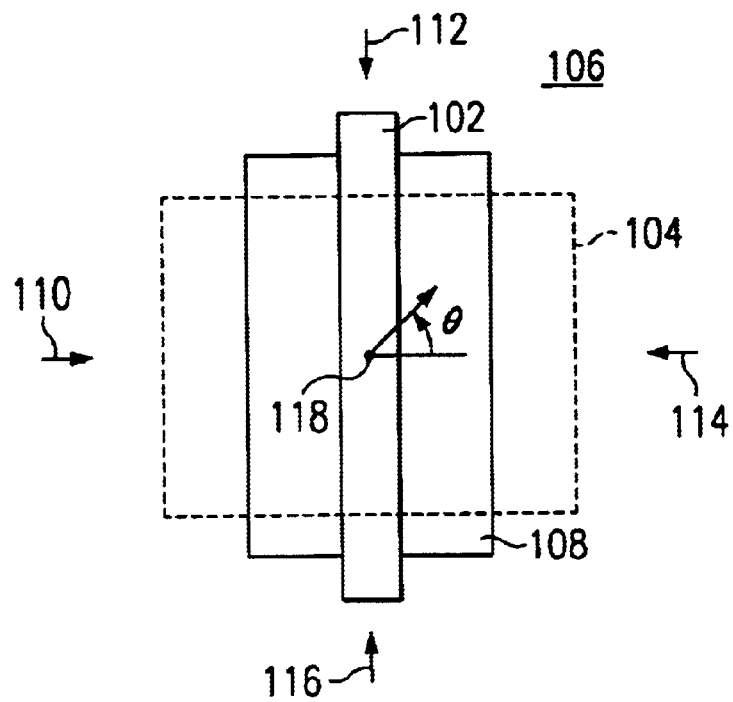
FIG. 1a is a top view of a partially fabricated device of the prior art.
Figure 1B:
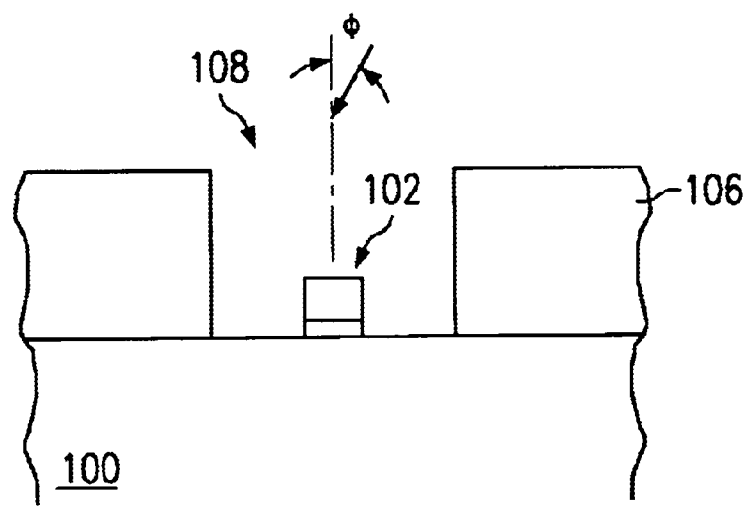
FIG. 1b is a cross-sectional view of a partially fabricated device of the prior art.

In essence, the methodology of the instant invention involves implanting dopant into the semiconductor at an angle, phi, from the normal of the wafer and rotating the wafer at off angles, theta, so as to implant dopants into one exposed semiconductor structure while not appreciably implanting dopants into another exposed semiconductor structure due to shadowing by another structure (such as the mask). While the following description revolves around the devices illustrated in FIGS. 2a and 2b, the methodology of the instant invention can be used to implant dopants into any type of structure. Furthermore, the methodology of the instant invention can be used to selectively subject one structure to a beam type energy while shadowing another structure from the same beam type energy.

Referring to FIGS. 2a and 2b, isolation structure 206 is formed in semiconductor structure 100. Preferably, isolation structure 206 is a shallow trench isolation structure ("STI"), but it can be formed as any isolation structure which is utilized in the semiconductor device fabrication industry (such as LOCOS, field oxide, or a doped region). Semiconductor structure 100 may be a single-crystalline silicon substrate or an epitaxial silicon layer formed on a single-crystal silicon substrate. Gate structures 102 and 103 are formed by depositing or growing a gate insulating layer (preferably comprised of an oxide, a nitride, an oxynitride, a high dielectric constant material, a stack of any of the above, or any combination thereof), forming a gate conductor (preferably comprised of polycrystalline silicon, a metal, or other conductor) on the gate insulating layer, patterning and etching the gate conductor and gate insulating layer so as to form the gate structure, and, if necessary, doping the gate conductor.

Masking layer 214 is formed and patterned so as to form openings 202 and 204. Masking layer 214 is preferably comprised of any type of photoresist material which is commonly used in the semiconductor device fabrication industry. However, masking layer 214 may be comprised of any other type of material, whether a conductor or insulator, which can be patterned and etched so as to form openings 202 and 204. Preferably, the height of masking layer 214 and the widths of openings 202 and 204 are sufficient to provide shadowing of implants 210 and 212 from reaching the semiconductor structure 100 in opening 202 while allowing implants 210 and 212 to reach semiconductor structure 100 exposed by opening 204.

The implants 210 and 212 performed at a desired angle phi and rotation angle theta to form pocket regions around gate structure 102 but without forming pocket regions around gate structure 103. Preferably, implants 210 and 212 are comprised of boron, phosphorous, arsenic, germanium, silicon, antimony, gallium, nitrogen, or any combination of the above dependent on the type of device being formed. The implantation angle, phi, is preferably around 15 to 60 degrees.

In order to properly dope the portion of semiconductor structure 100 which is exposed by opening 204, the wafer should be rotated and a portion of the dopants should be implanted at each rotation. However, the methodology of the instant invention also requires that the rotational angles be chosen so as to also shadow the portion of semiconductor structure 100 which is exposed by opening 202. Preferably, these rotational angles, theta, will be around 45, 135, 225, and 315 degrees, with around a quarter of the dopants being implanted at each one of these angles. A few more or less angles may be used to complete the doping required while still shadowing in the proper locations. Furthermore, theta does not have to be exactly 45, 135, 225, and 315 degrees, it may very by as much as 10 to 15 degrees.

It should be noted that the 0, 90, 180, and 270 degrees will not work because the full effect of the shadowing may not be realized using these values of theta due to the following reason. If the width of the region 302, defined in a direction parallel to the gate 103 in FIG. 2a, is large, then the implant 210 or 212 will not be blocked entirely from region 302 at the theta angles of 90 and 270 degrees. (This assumes the standard condition of the width of opening 202 being larger than the width of region 302.) Thus, the doping resulting from implants 210 or 212, if theta angles are 0, 90, 180, 270 degrees, will thus depend significantly on the width of region 302. However, if the theta angle is 45, 135, 225, 315 degrees, it is noted that the opening 202 can be defined appropriately to significantly block implants 210 or 212 from region 302, independent of the width opening 302.

Similarly, the width of opening 204 can be defined such that implants 210 and 212 are not blocked from region 304. Thus, as an example, pocket implants 216 can be formed in region 304, while not forming in region 302, as shown in FIG. 2c. It is further noted that while angled implants can be blocked by this process, implants formed at an angle phi of zero degrees will be implanted into both regions 302 and 304 if desired, for example to form not pocket regions but drain extension regions 218. Thus, the invention allows for formation of the same drain extension regions 218 around gate structures 102 and 103 but with different pocket implants 210 around gate structures 102 and 103.

Although specific embodiments of the present invention are herein described, they are not to be construed as limiting the scope of the invention. Many embodiments of the present invention will become apparent to those skilled in the art in light of methodology of the specification. The scope of the invention is limited only by the claims appended.

I claim:

1. A method of fabricating an integrated circuit, comprising the steps of:

forming a layer over a semiconductor body, said layer exposing a first region and a second region of the semiconductor body, wherein a width of said second region is less than a width of said first region;

implanting a dopant into said semiconductor body at an angle, phi, from normal using said layer and rotating the semiconductor body at off angles, theta, so as to implant the dopant into the first exposed region but not substantially into the second exposed region.

2. The method of claim 1, further comprising the step of implanting source and drain regions in said first exposed region and said second exposed region using the layer as a mask.

3. The method of claim 1, wherein said implanting step is performed at a plurality of angles, theta, wherein each angle theta is an off angle, said off angle being an angle other than 0, 90, 180, or 270 degrees.

4. The method of claim 1, wherein said implanting step is performed for at least four theta angles of 30–60, 120–150, 210–240, and 300–330 degrees.

5. The method of claim 1, wherein said implanting step is performed for at least four theta angles of approximately 45, 135, 225, and 315 degrees.

6. The method of claim 1, wherein said implant is performed at an angle phi in the range of 10–60 degrees.

7. The method of claim 1, wherein said layer is a masking layer, said first exposed region is a first transistor region, said second exposed region is a second transistor region, and wherein said implanting step forms a pocket region in the first transistor region but not in the second transistor region.

8. The method of claim 1, further comprising the steps of:

forming a first gate structure and a second gate structure over the semiconductor body prior to said step of forming a layer; and implanting source and drain regions in the first exposed region and the second exposed region using said layer and said first and second gate structures as a mask.

9. A method of fabricating an integrated circuit, comprising the steps of:

forming a first gate structure for a first transistor and a second gate structure for a second transistor over a semiconductor body;

forming a masking layer having at least two openings over the semiconductor body, a first of said openings exposing a portion of said first transistor and having a first width and a second of said openings exposing a portion of the second transistor and having a second width less than said first width;

angle implanting a dopant into said semiconductor body using said masking layer at a wafer rotational angle, theta, such that a pocket region is formed in said first transistor but not in said second transistor due to shadowing from said masking layer.

10. The method of claim 9, further comprising the step of implanting source and drain regions in said first transistor and said second transistor using said masking layer.

11. The method of claim 9, wherein said angle implanting step is performed at a plurality of angle thetas, wherein each angle theta is an off angle, said off angle being an angle other than 0, 90, 180, or 270 degrees.

12. The method of claim 9, wherein said angle implanting step is performed for at least four theta angles of 30–60, 120–150, 210–240, and 300–330 degrees.

13. The method of claim 9, wherein said angle implanting step is performed for at least four theta angles of approximately 45, 135, 225, and 315 degrees.

14. The method of claim 9, wherein said angled implant is performed at an angle phi in the range of 10–60 degrees.

* * * * *